(12) United States Patent
Ilislamoo et al.

(10) Patent No.: US 12,341,514 B1
(45) Date of Patent: Jun. 24, 2025

(54) CONTROLLING AND POWERING MULTIPLE CHIPS

(71) Applicant: Auradine, Inc., Santa Clara, CA (US)

(72) Inventors: Shahriar Ilislamoo, San Jose, CA (US); David Carlson, Haslet, TX (US); Barun Kar, Saratoga, CA (US); Darshan Shah, Milpitas, CA (US)

(73) Assignee: Auradine, Inc., Santa Clara, CA (US)

( * ) Notice: Subject to any disclaimer, the term of this patent is extended or adjusted under 35 U.S.C. 154(b) by 0 days.

(21) Appl. No.: 19/035,308

(22) Filed: Jan. 23, 2025

Related U.S. Application Data

(60) Provisional application No. 63/568,375, filed on Mar. 21, 2024.

(51) Int. Cl.
*H03K 19/23* (2006.01)
*G06F 7/57* (2006.01)
*H03K 19/08* (2006.01)

(52) U.S. Cl.
CPC ............... *H03K 19/23* (2013.01); *G06F 7/57* (2013.01); *H03K 19/08* (2013.01)

(58) Field of Classification Search
None
See application file for complete search history.

(56) References Cited

U.S. PATENT DOCUMENTS

| | | | |
|---|---|---|---|
| 5,623,202 A | 4/1997 | Yung | |
| 7,012,443 B2* | 3/2006 | Park | G01R 31/31926 324/762.02 |
| 7,350,108 B1* | 3/2008 | Dean | G01R 31/318505 714/724 |
| 8,581,626 B2* | 11/2013 | Asakura | H03K 19/17764 326/38 |
| 12,243,827 B1* | 3/2025 | Liu | G06F 1/206 |
| 2008/0191728 A1* | 8/2008 | Attalla | G01R 31/31721 257/E23.001 |

OTHER PUBLICATIONS

Invitation to Pay Additional Fees and, Where Applicable, Protest Fee in International Application No. PCT/US2025/012659, mailed on Mar. 5, 2025, 2 pages.

* cited by examiner

*Primary Examiner* — Jany Richardson
(74) *Attorney, Agent, or Firm* — Fish & Richardson P.C.

(57) ABSTRACT

An electronic circuit includes: an event detector logic circuit; a computing device; and a plurality of integrated circuit (IC) chips that are electrically connected in parallel between at least one control bus configured to provide input signals and the event detector logic circuit. The event detector logic circuit is configured to: receive a plurality of output signals from the plurality of IC chips, generate a data output signal that includes data obtained from a first output signal of the plurality of output signals, and transmit the data output signal to the computing device.

30 Claims, 6 Drawing Sheets

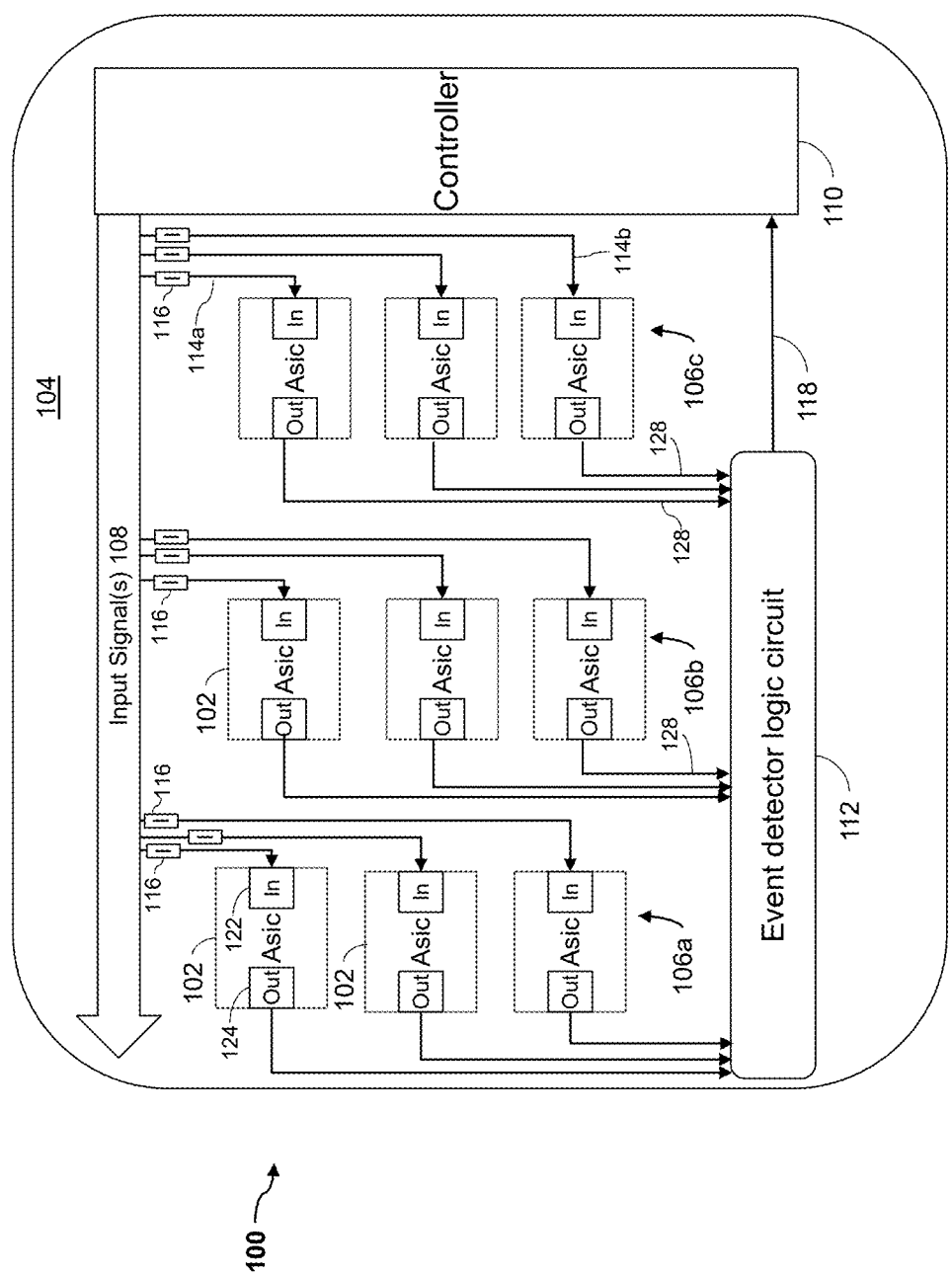

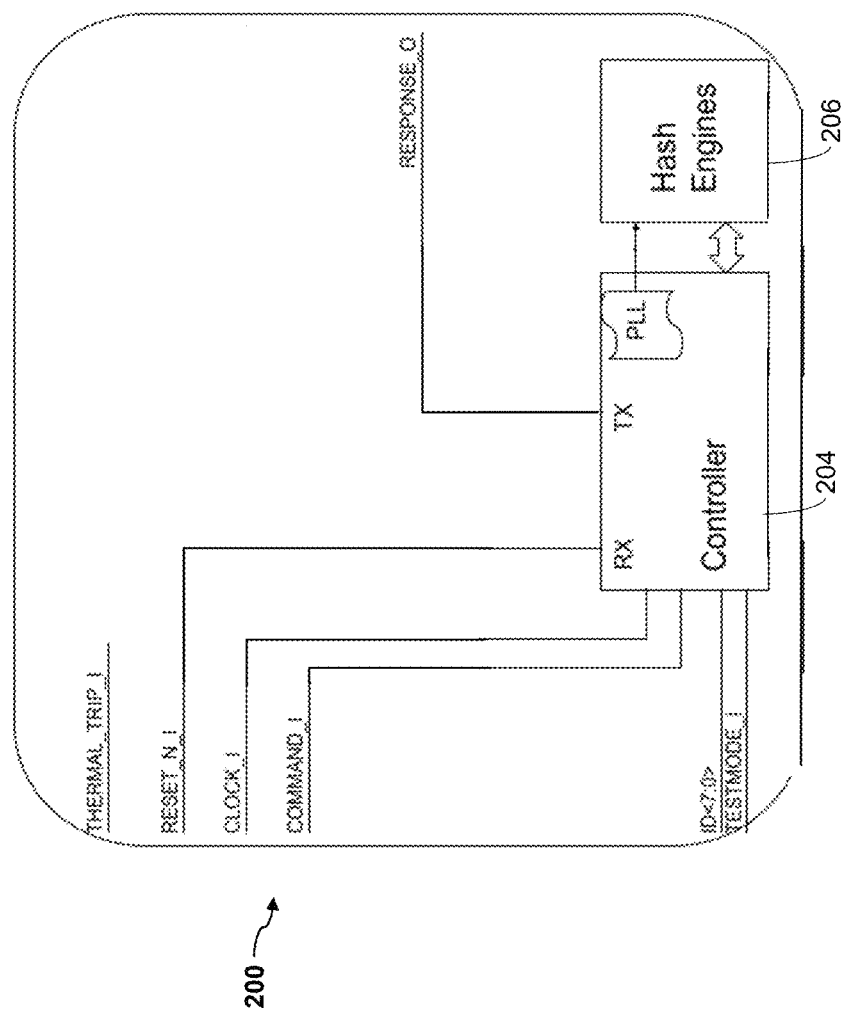

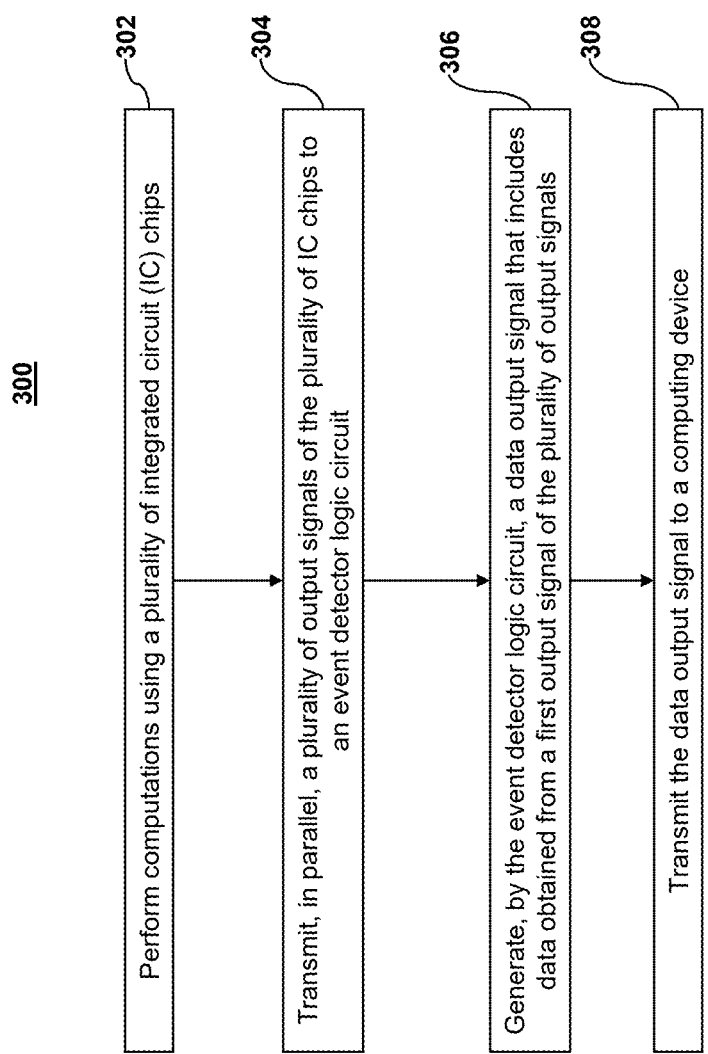

CONTROLLING AND POWERING MULTIPLE CHIPS

CROSS-REFERENCE TO RELATED APPLICATION

This application claims the benefit of the filing date of U.S. Provisional Patent Application No. 63/568,375, filed on Mar. 21, 2024, the entirety of which is incorporated herein by reference.

FIELD OF THE DISCLOSURE

This specification generally relates to signal processing and power control and, more specifically, to methods, integrated circuit (IC) chips, and electronic circuits related to processing and transmitting signals for multiple chips.

BACKGROUND

An electronic circuit can include multiple IC chips. Each of the IC chips can generate signals indicative of computations performed by the IC chips.

BRIEF DESCRIPTION OF THE DRAWINGS

FIGS. 1A-1B are diagrams illustrating an example of an electronic circuit.

FIGS. 2A-2B are diagrams illustrating examples of integrated circuit (IC) chips.

FIG. 3 is a diagram illustrating an example of signal processing.

SUMMARY

Figure 1B:
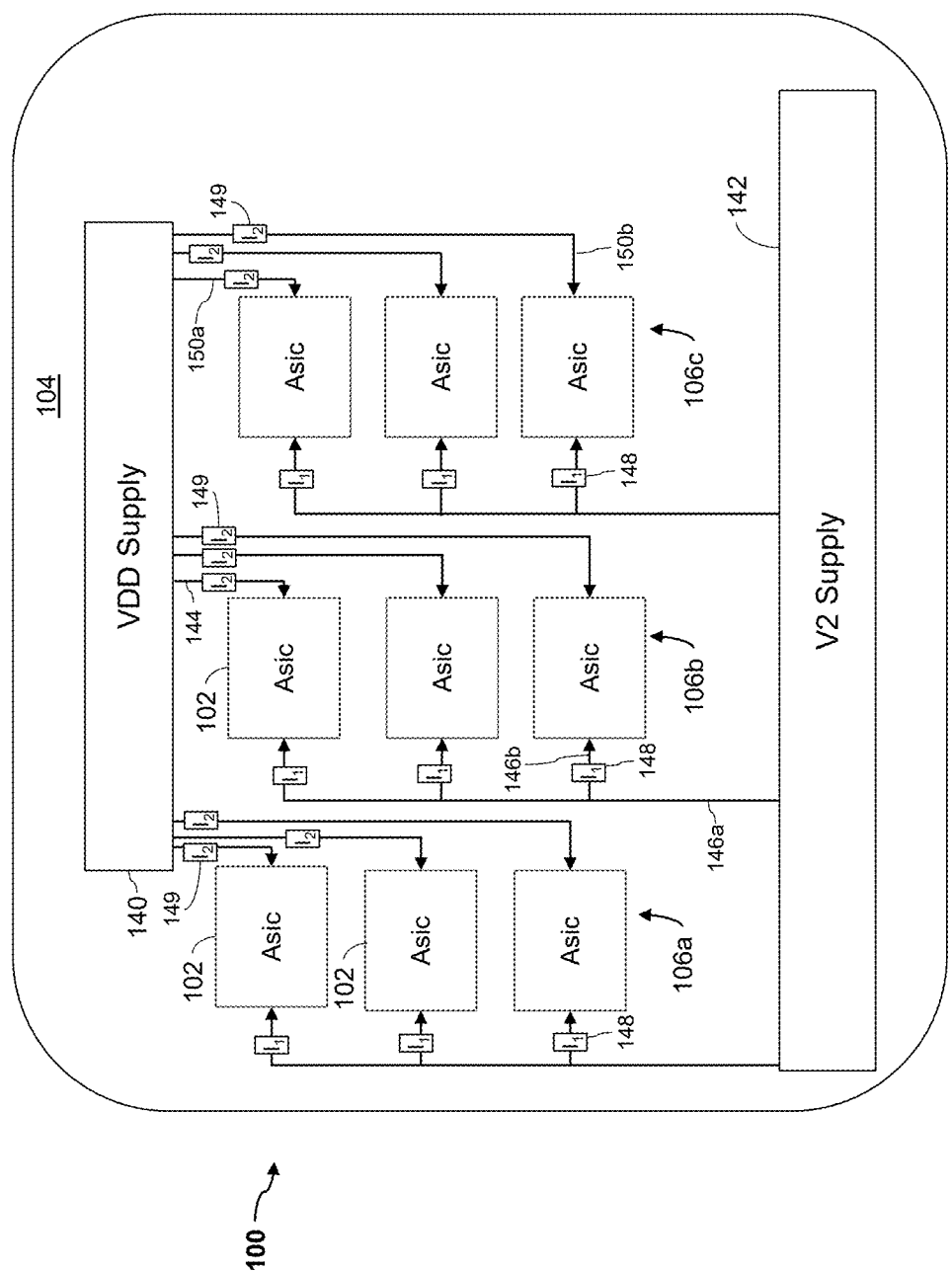

The aspects of the present disclosure relate to an electronic circuit. The electronic circuit includes: an event detector logic circuit; a computing device; and a plurality of integrated circuit (IC) chips that are electrically connected in parallel between at least one control bus providing input signals and the event detector logic circuit. The event detector logic circuit is configured to: receive a plurality of output signals from the plurality of IC chips, generate a data output signal that includes data obtained from a first output signal of the plurality of output signals.

This and other electronic circuits described herein can have one or more of at least the following characteristics.

In some implementations, the data output signal is generated such that the data is included in the data output signal insensitively to a presence and polarity of any static output signals of the plurality of output signals, and transmit the data output signal to the computing device In some implementations, the event detector logic circuit includes an XOR logic element configured to: perform a combined XOR operation on the plurality of output signals; and transmit, as the data output signal, an output of the combined XOR operation to the computing device.

In some implementations, the event detector logic circuit is configured to detect whether the plurality of output signals include data or are static.

In some implementations, the event detector logic circuit is configured to generate the data output signal such that the data output signal indicates changes in the plurality of output signals.

In some implementations, the event detector logic circuit is configured to generate the data output signal such that the data output signal indicates bit-to-bit changes in the plurality of output signals.

In some implementations, the event detector logic circuit is configured to generate the data output signal such that a presence of bit-to-bit changes in the data output signal is independent of the presence and polarity of any static output signals of the plurality of output signals.

In some implementations, the event detector logic circuit is configured to generate the data output signal such that a polarity of the data output signal is based on the presence and polarity of any static output signals of the plurality of output signals.

In some implementations, the data in the data output signal is encoded as a plurality of bits. The event detector logic circuit is configured to generate the data output signal such that a polarity of the plurality of bits is based on the presence and polarity of any static output signals of the plurality of output signals.

In some implementations, the computing device is configured to: determine a polarity of the data output signal.

In some implementations, the computing device is configured to extract the data from the data output signal based on the determined polarity of the data output signal.

In some implementations, the electronic circuit includes a plurality of isolation resistors electrically connected between a signal input of each of the plurality of IC chips and the at least one control bus.

In some implementations, the electronic circuit includes: a power supply configured to provide a supply voltage to a power input of each of the plurality of IC chips; and a plurality of isolation resistors electrically connected between the power input of each of the plurality of IC chips and the power supply.

In some implementations, the computing device is configured to identify a predetermined non-static signal in the data output signal.

In some implementations, an IC chip of the plurality of IC chips includes at least one processor unit configured to perform one or more mathematical computations, and the IC chip is configured to generate an output signal based on the one or more mathematical computations and forward the output signal to the event detector logic circuit as one of the plurality of output signals.

In some implementations, the one or more mathematical computations includes cryptographic hash computations, and the output signal includes an indication of a result of the cryptographic hash computations.

In some implementations, the cryptographic hash computations include blockchain computations.

In some implementations, the IC chip is configured to automatically generate and forward the output signal in response to determining that the one or more mathematical computations satisfy an objective.

Some aspects of this disclosure relate to a method. The method includes: performing computations using a plurality of integrated circuit (IC) chips; transmitting, in parallel, a plurality of output signals of the plurality of IC chips to an event detector logic circuit; generating, by the event detector logic circuit, a data output signal that includes data obtained from a first output signal of the plurality of output signals; and transmitting the data output signal to a computing device.

This and other methods described herein can have one or more of at least the following characteristics.

In some implementations, the data output is generated such that the data is included in the data output signal insensitively to a presence and polarity of any static output signals of the plurality of output signals.

In some implementations, generating the data output signal includes performing a combined XOR operation on the plurality of output signals. The data output signal includes an output of the combined XOR operation.

In some implementations, the method includes detecting, by the event detection logic circuit, whether the plurality of output signals include data or are static.

In some implementations, the method includes generating the data output signal such that the data output signal indicates changes in the plurality of output signals.

In some implementations, the method includes generating the data output signal such that the data output signal indicates bit-to-bit changes in the plurality of output signals.

In some implementations, the method includes generating the data output signal such that a presence of bit-to-bit changes in the data output signal is independent of the presence and polarity of any static output signals of the plurality of output signals.

In some implementations, the method includes generating the data output signal such that a polarity of the data output signal is based on the presence and polarity of any static output signals of the plurality of output signals.

In some implementations, the method includes generating the data output signal such that: the data in the data output signal is encoded as a plurality of bits, and a polarity of the plurality of bits is based on the presence and polarity of any static output signals of the plurality of output signals.

In some implementations, the method includes determining, by the computing device, a polarity of the data output signal.

In some implementations, the method includes extracting, by the computing device, the data from the data output signal based on the determined polarity.

In some implementations, the method includes electrically isolating a signal input of each of the plurality of IC chips from other IC chips using a plurality of isolation resistors electrically connected between the plurality of IC chips and at least one control bus.

In some implementations, the method includes: providing a supply voltage to a power input of each of the plurality of IC chips; and electrically isolating the power input of each of the plurality of IC chips from other IC chips using a plurality of isolation resistors on power transmission paths providing the supply voltage.

In some implementations, the method includes: performing, by an IC chip of the plurality of IC chips, one or more mathematical computations; generating, by the IC chip, an output signal based on the one or more mathematical computations; and forwarding, by the IC chip, the output signal to the event detector logic circuit, as one of the plurality of output signals.

In some implementations, the one or more mathematical computations include cryptographic hash computations, and the output signal includes an indication of a result of the cryptographic hash computations.

In some implementations, the cryptographic hash computations include blockchain computations.

In some implementations, the method includes automatically generating and forwarding the output signal in response to determining that the one or more mathematical computations satisfy an objective.

In some implementations, the method includes identifying, by the computing device, a predetermined non-static signal in the data output signal.

In some implementations, the method includes: transmitting input signals to one or more of the IC chips of the plurality of IC chips in parallel; and causing the plurality of IC chips to perform the computations upon receiving the input signals.

Some aspects of this disclosure relate to an electronic circuit that includes: a plurality of integrated circuit (IC) chips that are electrically connected in parallel between (i) at least one control bus providing input signals and (ii) circuitry configured to receive output signals from the plurality of IC chips; a power supply configured to provide a supply voltage to a power input of each of the plurality of IC chips; and a plurality of isolation resistors electrically connected between at least one of: (i) a signal input of each of the plurality of IC chips and the at least one control bus, or (ii) the power input of each of the plurality of IC chips and the power supply.

The details of one or more implementations are set forth in the accompanying drawings and the description below. Other aspects, features and advantages will be apparent from the description and drawings, and from the claims.

DETAILED DESCRIPTION

This disclosure relates to signal processing and power control for electronic circuits including multiple ICs. In some implementations, an electronic circuit board (e.g., a printed circuit board, PCB) includes multiple ICs that are connected in parallel between a signal source (e.g., from which control signals are received concurrently by the multiple ICs) and an event detector logic circuit element (e.g., which receives output signals from the multiple ICs in parallel), which improves the reliability of the electronic circuit in the context of possible IC failures (e.g., signal shorts/open circuits). In some implementations, signal inputs and/or power inputs of the multiple ICs can be isolated using resistors, providing low-cost isolation and improving the reliability of the electronic circuit in the case of power-related failures (e.g., power shorts/open circuits). In some implementations, the event detector logic circuit element includes an Exclusive Or (XOR) logic element. In some implementations, the event detector logic circuit element includes a computing device configured to detect data in output signals from the multiple ICs, and to output the data. In some implementations, the inclusion of data in the output of the event detector logic circuit element is insensitive to the presence and/or polarity of static output signals from the multiple ICs FIGS. 1A-1B illustrate an example of an electronic circuit 100 according to some implementations of this disclosure. FIG. 1A illustrates signal transmission and processing in the electronic circuit 100, and FIG. 1B illustrates power supply in the electronic circuit 100.

The electronic circuit 100 includes multiple integrated circuit (IC) chips 102. In this example, the IC chips 102 are application-specific integrated circuits (ASICs), but the IC chips 102 can be of any one or more suitable types in various implementations, such as general-purpose processor chips, field-programmable gate array (FPGA) chips, etc. In some implementations, the IC chips 102, controller 110, event detector logic circuit 112, VDD supply 140, and/or V2 supply 142 are mounted on/coupled to a common board 104, e.g., a printed circuit board (PCB). For example, interconnections between the IC chips 102 and/or between the IC chips 102 and other elements (e.g., controller 110, event detector logic circuit 112, and/or power supplies 140, 142) can include metal traces in and/or on the common board 104.

Figure 2A:
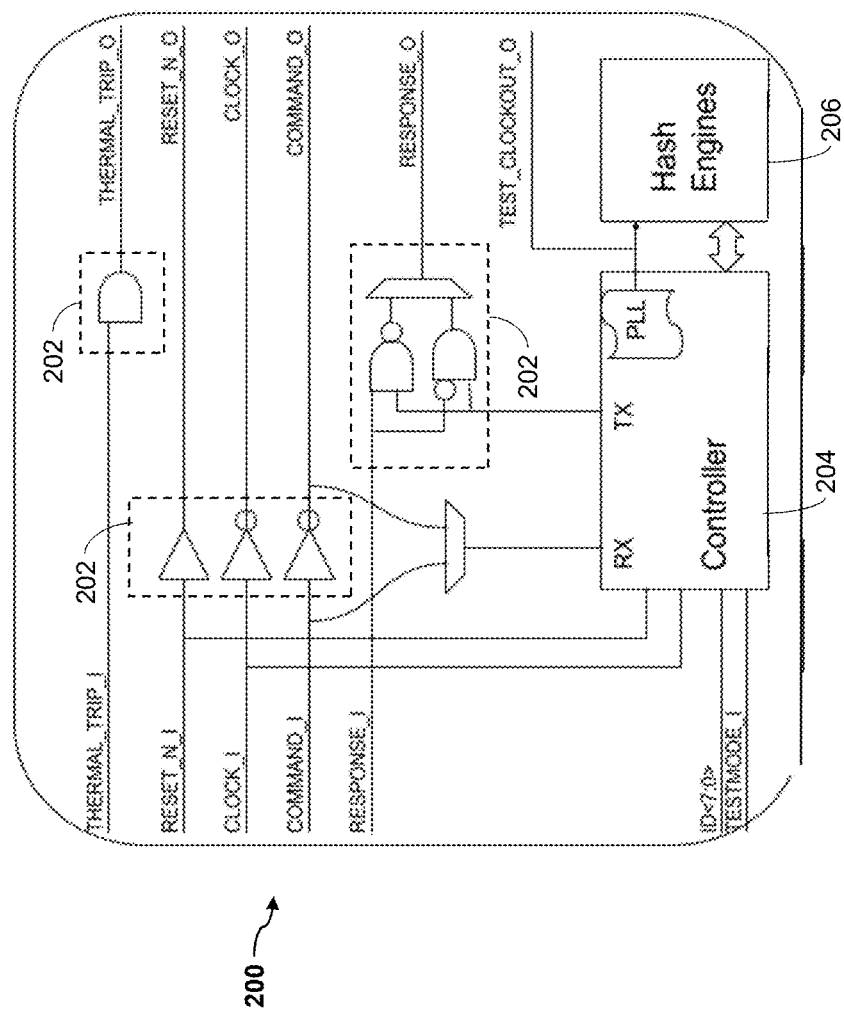

In some implementations, the IC chips 102 and other elements of the electronic circuit 100 are included in a common enclosure, cabinet, and/or case. Examples of schematics of IC chips 102 are shown in FIGS. 2A-2B, discussed in further detail below.

In this example, the IC chips 102 are grouped into in three groups (e.g., corresponding to rows or columns in which the IC chips 102 are arranged) 106a, 106b, 106c, each group 106 including three IC chips 102. However, in some implementations, the IC chips 102 are not divided into groups. Moreover, the number of groups and number of IC chips 102 in each group can vary in different implementations.

In some implementations, the electronic circuit 100 includes multiple buses, such as a command bus, a response bus, a clock bus, a reset bus, one or more power buses, etc. Each of the IC chips 102 can include terminals (e.g., pins) coupled to one or more of the buses. For example, each of the IC chips 102 can include a control input terminal (e.g., control input terminal 122) coupled to at least one control bus providing input signals 108. In some implementations, each of the IC chips 102 can include an input terminal coupled to a clock bus for receiving a clock signal, and/or an input terminal coupled to a reset bus for receiving a reset signal.

The electronic circuit 100 further includes a controller 110, for example, a central processing unit (CPU), computing device, host device, etc. In some implementations, the controller 110 is on the common board 104 with the IC chips 102. In some implementations, the controller 110 is separated from the IC chips 102, e.g., outside an enclosure housing the IC chips 102. Although the controller 110 is shown as both providing input signals and receiving an output 118, in some implementations, separate elements (e.g., separating computing devices) can provide inputs to and receive outputs from the IC chips 102.

In some implementations, electronic circuit 100 is configured to perform cryptographic operations, e.g., a blockchain mining process, using the IC chips 102. In such cases, the electronic circuit 100 can be deployed for applications that rely on blockchain mining, e.g., for cryptocurrency mining, maintaining linked records of digital transactions, etc. In this context, a blockchain is a decentralized and distributed digital ledger that records units of information, e.g., transactions, across multiple computers or nodes. In a blockchain, transactions are grouped into blocks and added to a chain of previous block, forming a chronological sequence. Each block includes a unique identifier, e.g., hash value, and a reference to the previous block, creating a linked structure. The blocks in the same blockchain are linked by having their hash values inserted into a designated field, e.g., a block header, in the next sequential block in the blockchain. A process of blockchain mining is designed to allow a blockchain system to reach a consensus in which all computation nodes in the blockchain system agree to a same blockchain. An example mining process by a computation node of a blockchain system can include computing a valid proof-of-work for a block candidate that will be added to a blockchain. The proof-of-work for a block can include a nonce value that, when inserted into a designated field of the block, makes the cryptographic hash value of the block meets, e.g., equal to or less than, a certain difficulty target set by the system.

In some implementations, the IC chips 102 can be configured or customized to perform computations instructed by the controller 110. For example, the IC chips 102 can receive (e.g., at input terminals 122) input signals 108 from the controller 110 instructing the IC chips 102 to perform computations for a particular task. After receiving the input signals 108, each of the IC chips 102 can perform the computations indicated/commanded by the input signal and transmit an output signal 128 (e.g., from an output terminal 124) to an event detector logic circuit 112.

In some implementations, the controller 110 is configured to carry out arithmetic and logic operations, data manipulations, and control flow management in accordance with operations of the electronic circuit 100. In some implementations, the controller 110 can include components such as a control unit, an arithmetic logic unit, one or more registers, and one or more caches, etc. The control unit of controller 110 manages the flow of data between different components of the controller 110, and can be configured to fetch instructions from a memory, decode the instructions, and coordinate execution of the instructions. The arithmetic logic unit can be configured to perform arithmetic operations (e.g., addition, subtraction, multiplication, and division), and logical operations (e.g., AND, OR, and NOT) on data. The registers of the controller 110 can be configured to store temporary data, instructions, and intermediate results during processing. The registers can also include a program counter which keeps track of the address of the next instruction to be executed, and general-purpose registers for storing data. The caches of the controller 110 can be configured to temporarily store frequently accessed data and instructions.

In some implementations, for example, as shown in FIG. 1A, the controller 110 can be configured to transmit input signals 108 to the IC chips 102. The input signals 108 are provided to the IC chips 102 in parallel. For example, at least some of the IC chips 102 can receive the input signals 108 from the controller 110 (in some cases with intermediate processing such as level-shifting, isolation, etc., as discussed further below), as opposed to from another of the IC chips 102 in a series-configuration "daisy-chained" arrangement in which a signal output of each IC is coupled to a signal input of another IC chip in turn. For example, as discussed in further detail below, the controller 110 can provide the input signals 108 for receipt by each of the IC chips 102, and the input signals 108 can include identifier(s) identifying target IC chip(s) of the IC chips 102 to perform operations instructed by the input signals 108.

In some implementations related to a mining process, the controller 110 can send at least one input signal 108 (e.g., on a command bus) to the IC chips 102, where the at least one input signal 108 transmits a command to perform hash computations to find a nonce for a current block header that makes a hash of the block header meet a difficulty target. Each one of the IC chips 102 performs the hash computations in response to the at least one input signal 108. In some examples, an IC chip 102 can randomly choose a nonce and insert the nonce into the current block header, and generate a new block header hash. If the new block header hash is less than or equal to that indicated by the difficulty target, the IC chip 102 can generate a computation result based on the nonce. This process can be repeated until the IC chip 102 finds a nonce that produces a hash that is less than or equal to that indicated by the difficulty target.

In some implementations, when one of the IC chips 102 obtains a nonce that makes the new block header hash meet the difficulty target, the IC chip 102 can generate a data signal indicating the nonce, and transmit the data signal as the output signal 128 of the IC chip 102 using an output terminal of the IC chip 102 (e.g., output terminal 124, sometimes referred to as a "signal output" or "response-out"). In some implementations, the output (data) signal is a series of bits in a pattern that indicates a value of the nonce. When one of the IC chips 102 does not obtain a nonce that makes the new block header hash meet the difficulty target, the chip can generate an idle signal (e.g., a signal of ten "1"s) or stay quiet (e.g., can output a constant "0" or a constant "1").

In some implementations, when one of the IC chips 102 obtains a nonce that makes the new block header hash meet the difficulty target, the IC chip 102 can generate and transmit the data signal indicating the nonce automatically, e.g., without waiting for a polling command (e.g., a command that causes a read operation to be performed on the IC chips 102, or another type of command that represents the controller 110 asking the IC chips 102 to provide the nonces) or other command. For example, the nonces can be provided without a polling operation. In some implementations, when one of the IC chips 102 obtains a nonce that makes the new block header hash meet the difficulty target, the IC chip 102 can store the nonce in the IC chip 102 (e.g., in an internal storage, such as a register, of the IC chip 102), and can generate and transmit the data signal indicating the nonce in response to receiving a read command corresponding to a polling operation (e.g., in the input signals 108), for example, from the controller 110. In some implementations, the controller 110 is configured to (periodically and/or in response to a command to the controller 110) poll each IC circuit 102 (e.g., serially, one by one) to cause each IC chip 102 to transmit stored nonce(s) to the event detector logic circuit 112, if obtained. In cases in which polling is performed, corruption associated with simultaneous signal transmission from multiple IC chips 102 can be avoided.

The IC chips 102 are electrically connected (with respect to their signal inputs and signal outputs) between the controller 110 (e.g., by a coupling to at least one control bus providing the input signals 108) and the event detector logic circuit 112. For example, an output of each IC chip 102 can be electrically connected to or otherwise provided to the event detector logic circuit 112. In some implementations, the event detector logic circuit 112 includes an input terminal corresponding to each of the IC chips 102, and the input terminal is connected (in some cases with intermediate processing, such as level-shifting) to the signal output terminal (e.g., output terminal 124) of the corresponding IC chip 102. In some implementations, each input terminal of the event detector logic circuit 112 can be arranged/configured to receive an idle signal, or no signal, from the corresponding IC chip 102 when the corresponding IC chip 102 has not obtained a nonce that makes the new block header hash meet the difficulty target, and to receive a series of bits in a pattern that indicates a value of the nonce when the corresponding IC chip 102 has obtained a nonce that makes the new block header hash meet the difficulty target.

Signals exchanged to/from the IC chips 102 can correspond to interconnections, e.g., metal traces, wires, and/or other conductive elements. For example, in some implementations, the electronic circuit 100 includes for each IC chip 102, (i) at least one interconnection electrically coupling a signal input terminal 122 of the IC chip 102 to the controller 110 (in some cases with one or more intermediate elements such as a level-shifter, isolator, etc.), and (ii) at least one interconnection electrically coupling a signal output terminal 124 of the IC chip 102 to the event detector logic circuit 112 (in some cases with one or more intermediate elements such as a level-shifter, isolator, etc.).

The event detector logic circuit 112 can be any circuit configured to perform one or more operations (e.g., an aggregate operation) on the outputs of all the IC chips 102 (e.g., concurrently-received outputs) to reduce the outputs to one active output 118 (e.g., provided on a single signal line). The event detector logic circuit 112 is configured to generate the output 118 such that the output 118 includes the data of, and/or obtained from, data signals output by the IC chips 102 in a manner independent of static signals output by the IC chips 102 (e.g., insensitive to, or independent of, the polarity of static signals output by the IC chips 102). For example, as discussed in further detail below, the output 118 can indicate changes in the output signals independent of the presence/polarity of static signals, can be entirely unchanged or at most change in polarity in response to the presence/polarity of static signals, or can otherwise generate the output 118 such that the data is provided in the output 118 independent of the presence/polarity of static signals. For example, the event detector logic circuit 112 can implement a combined XOR operation on the outputs of the IC chips 102, thereby satisfying the condition that the data is included in the output signal independent of the presence/polarity of any static output signals.

The configuration of the event detector logic circuit 112 to output the data independently of the presence and polarity of any static output signals is relevant and useful at least in view of IC chip failure. Over the course of operation of the electronic circuit 100, the IC chips 102 may fail, e.g., due to overheating, stress due to prolonged operation, etc. For example, transmission paths for signals may be shorted or made into open circuits due to failure of the IC chips 102. For purposes of this disclosure, it has been recognized that such shorts and open signals are likely to result in a static (constant) output from a failed IC chip 102, e.g., a constant "0" signal or a constant "1" signal, depending on the specifics of the failure. The polarity of the static signal resulting from IC chip failure may not be predictable in advance. The event detector logic circuit 112 can be configured to provide an output 118 that is indicative of events (e.g., combinations of "0s" and "1s" that represent data, such as nonce values) in an output signal 128 including data from the IC chips 102, where the output 118 is not negatively affected by the presence or polarity of one or more static signals among the output signals 128 (e.g., where the one or more static signals are received concurrently with the data-including signal).

For example, the event detector logic circuit 112 can be configured to generate the output 118 such that the output 118 indicates changes in the outputs of the IC chips 102 (e.g., indicates when an output signal 128 includes a "0" followed by a "1" or a "1" followed by a "0"), and such that the output 118 is insensitive to or independent of (e.g., not dependent at all on, or having at most a polarity that depends on) the presence and/or polarity of one or more static signals among the output signals 128 received concurrently with the changing output(s). For example, in some implementations, the presence of bit-to-bit changes in the output 118 (e.g., the presence of a "0" follow by a "1" or a "1" followed by a "0") is independent of the polarity of static outputs provided by the IC chips 102 and received by the event detector logic circuit 112. In some implementations, the event detector logic circuit 112 is configured to include, in the output 118, data in one or more of the output signals 128, and to generate the output 118 independent of the presence and/or polarity of static outputs from the IC chips 102. The event detector logic circuit 112 can include any suitable circuitry, such as computing circuitry, digital logic circuitry, and/or analog circuitry to perform the functions described herein.

For example, in some implementations, the event detector logic circuit 112 is configured to individually analyze the output signals 128 in parallel, e.g., to detect events (such as embedded data corresponding to nonce values or other computation outputs) in the output signals 128. For example, the IC chips 102 can be configured to generate the output signals 128 according to a protocol that includes a start bit, data bits, and a stop bit (e.g., the protocol discussed in further detail below). The event detector logic circuit 112 can be configured to individually analyze each output signal 128 to detect the presence of a start bit (and, in some implementations, the presence of data bits and/or a stop bit) and, based on the detection, determine that data (corresponding to an event) is present in the output signal 128. In some implementations, the event detector logic circuit 112 is configured to distinguish between non-static signals (corresponding to events) and static signals, to detect events. Based on the detection and/or determination that data is present, the event detector logic circuit 112 can include the data in the output 118 provided to the controller 110. To perform these operations, the event detector logic circuit 112 can include digital logic, e.g., a microcontroller, a microprocessor, ASIC, and/or the like.

As another example, in some implementations, the event detector logic circuit 112 is configured to detect static signals (for example, by detecting a certain number of consecutive "0s" or "1s" in an output signal 128) and discount the static signals, e.g., exclude the static signals from inclusion in the output 118, or otherwise prevent the presence of static signals from affecting the output 118. To perform these operations, the event detector logic circuit 112 can include analog and/or digital circuitry. For example, the event detector logic circuit 112 can include an analog or a digital filter configured to filter-out static signals from an input used to generate the output 118.

As another example, in some implementations, the event detector logic circuit includes XOR logic element circuitry configured to perform a combined XOR operation on the output signals of the IC chips 102 (e.g., output signals 128). The combined XOR operation can output a first value (e.g., "1") when receiving an even number of "1" inputs from the IC chips 102, and can output a second value (e.g., "0") when receiving an odd number of "1" inputs from the IC chips 102. When all other outputs of the IC chips 102 are held constant, a change in output of one of the IC chips 102 from "1" to "0" or from "0" to "1" results in the output of the combined XOR operation changing from "1" to "0" or from "0" to "1;" whether the change is from "0" to "1" or from "1" to "0" depends on the current outputs of the other IC chips 102. The XOR logic element can transmit the output of the combined XOR operation as an output 118 (e.g., on a single signal line), e.g., to the controller 110 or to another computing device. Accordingly, the inclusion of data in the output 118 of the XOR logic element is independent of the presence and/or polarity of static output signals from IC chips 102, because the data is encoded in the output 118 regardless of the presence and/or polarity of static output signals from the IC chips 102; the static output signals either have no effect on the output 118, or cause the output 118 to encode the same data using an opposite polarity.

The circuitry of the XOR logic element configured to perform the combined XOR operation can include any suitable circuit, e.g., computing circuitry and/or "hard-coded" XOR circuitry. For example, the XOR logic element can include one or more multiplexers, one or more filters, or a combination thereof. For example, the event detector logic circuit 112 can include multiple cascaded two-input XOR gates, where outputs of two of the IC chips 102 are provided to a first two-input XOR gate, the output of the first two-input XOR gate is provided as input to a second two-input XOR gate along with an output of a third of the IC chips 102, the output of the second two-input XOR gate is provided as input to a third two-input XOR gate along with an output of a fourth of the IC chips 102, etc., until the combined XOR operation has been performed based on outputs from each of the IC chips 102. Each two-input XOR gate can include, for example, a plurality of transistors configured to implement AND-OR-Invert (AOI) logic. In some implementations, the event detector logic circuit 112 includes a computing device programmed to perform the combined XOR operation. Other suitable methods of performing the combined XOR operation are also within the scope of this disclosure. Further, it will be understood that event detection is not limited to use of a combined XOR operation, and that other types of processing (e.g., having one or more of the signal characteristics described as resulting from the XOR operation) are also within the scope of this disclosure.

In some implementations, the event detector logic circuit 112 is included in the controller 110.

In some implementations, the IC chips 102 perform computations that produce a target output relatively rarely. For example, in some mining implementations, the IC chips 102 obtain a nonce that makes a new block header hash meet a difficulty target relatively rarely. It is very unlikely that two IC chips 102 will output a signal corresponding to the target output (e.g., a series of bits in a pattern that indicates a value of the nonce) at the same time. Accordingly, the output 118 of the XOR logic element is usually constant at "0" or "1," and, when the output 118 does include a varying signal, it is very likely that the varying signal corresponds to an output signal from a single one of the IC chips 102 producing a target output. The varying signal will either be the output signal itself (e.g., where "0" in output 118 corresponds to a "0" output by the one of the IC chips 102, and where "1" in output 118 corresponds to a "1" output by the one of the IC chips 102), or an inverted version of the output signal, depending on a parity of the outputs of the other IC chips 102.

In some cases, the use of an XOR logic element as the event detector logic circuit 112 can provide advantages, e.g., for processing speed and/or processing simplicity, compared to other approaches. For example, in some implementations, the XOR logic element can generate and transmit its output directly based on concurrently-received input signals 128, e.g., without requiring a register or other storage. In some implementations, XOR operations performed by the XOR logic element may be faster and/or more power-efficient than alternative event detection methods that rely on a programmed computer. However, the scope of the event detector logic circuit 112 is not limited to XOR logic elements.

These and similar configurations of the event detector logic circuit to generate the output 118 irrespective of the presence and/or polarity of static output signals from the IC chips 102 can provide a high degree of robustness for computation and signal processing by the electronic circuit 100. In some cases, shorts and opens on signal paths to, from, and/or within the IC chips can be a common point of failure in electronic circuits including multiple IC chips. In circuits in which the IC chips are connected in a series-configuration "daisy-chained" arrangement (in which a signal output of each IC chip is coupled to a signal input of another IC chip in turn, and the IC chips one-by-one "pass on" the received signals in their outputs, until a final signal is output), a short or open in one of the IC chips, or in one signal path between IC chips, may mean that the entire group/chain of series-connected IC chips fails, because signals can no longer be provided through each IC chip in the series configuration.

By contrast, in some implementations according to this disclosure, such as the electronic circuit 100 of FIGS. 1A-1B, failure in any one of the IC chips 102, or along a signal path to/from any one of the IC chips 102, does not inhibit the overall operation of the electronic circuit 100 using the remaining functional IC chips 102. This constant static output does not cause toggling of the output 118 of the event detector logic circuit 112 but may, at most, cause a constant change to the parity of the output 118. For example, in the case where the event detector logic circuit 112 is an XOR logic element and is outputting a constant output 118 of "0," if an IC chip 102 fails and begins outputting a constant "1" where the IC chip 102 before was outputting a constant "0," the event detector logic circuit 112 would then output a constant output 118 of "1," which corresponds to the same constant signal as before the failure, but with reversed polarity. As a further example, in a case where a (non-failed) IC chip 102 outputs a signal that includes "11001" to indicate a successful computation (e.g., successful nonce identification), the event detector logic circuit 112 may, based on receiving "11001" and based on the failure of the failed IC chip 102, output the reversed-polarity signal "00110" based on the failure of the IC chip 102. If a second IC chip 102 has also failed and is also outputting a constant "1," the event detector logic circuit 112 would output "11001," in accordance with the parity-based combined XOR operation.

Accordingly, failure events that result in static outputs from the IC chips 102 can be easily detected and compensated for by the controller 110 or other computing device receiving the output 118 of the event detector logic circuit 112. For example, in some implementations, the controller 110 can perform operations to determine a polarity of the output 118. This determination can be performed, for example, upon start-up of the electronic circuit 100, periodically, and/or in response to a specific instruction to the controller 110. As an example of the operations, the controller 110 can monitor the output 118 and identify a series of constant bits, e.g., constant "0" or constant "1," having a predetermined length (e.g., five bits). If the series of constant bits is "0," the controller 110 can determine the output 118 as having a first polarity, and, if the series of constant bits is "1," the controller 110 can determine the output 118 as having a second polarity. Other signal schemes are also within the scope of this disclosure. For example, in some implementations, at least one of the IC chips 102 can output a predetermined non-static signal to the event detector logic circuit 112, and the controller 110 can receive a corresponding non-static output 118 and determine the polarity based on the non-static output 118. For example, the at least one of the IC chips 102 can output a predetermined calibration signal "110110." If the controller receives "110110," the controller 110 determines the output 118 as having a first polarity, and, if the controller 110 receives "001001," the controller 110 determines the output 118 as having a second polarity.

In some implementations, the controller 110 is configured to extract data from the output 118. For example, the data can include a nonce value successfully obtained by one of the IC chips 102 and encoded in/output as an output signal provided to the event detector logic circuit 112. The data can be encoded using any suitable format/protocol, e.g., as an RS232 data transmission provided in the output 118. In some implementations, the controller 110 can extract the data based on the determined polarity. For example, if the controller 110 determines that the polarity is inverted, the controller can invert the as-received output 118, to recover an un-inverted signal, and process the obtained un-inverted signal. In the case where the controller 110 determines that the polarity is not inverted, the controller 110 can process the output 118 as-received.

For example, in some implementations, the IC chips 102 and the controller 110 are configured to use a protocol in which "0" is a start bit, and the start bit is followed by data bits (e.g., eight data bits) encoding data. The controller can generate an un-inverted signal based on the determined inverted polarity, identify a start bit based on detecting "0" in the un-inverted signal, and, in response to identifying the start bit, extract data from the data based. As another example, the controller can, based on the determined inverted polarity, identify a start bit based on detecting "1" (e.g., without generating an un-inverted signal), and, in response to identifying the start bit, extract data from the data bits based on the determined polarity. As another example, the controller can, based on a determined un-inverted polarity, identify a start bit based on detecting "0," and, in response to identifying the start bit, extract data from the data based on the determined polarity. In some implementations, the data bits are followed by a stop bit (e.g., "1").

Accordingly, even in scenarios in which one or more of the IC chips 102 have failed and are outputting static outputs, the remaining IC chips 102 can continue operating, and the controller 110 can successfully obtain and process data from the remaining IC chips 102.

In some implementations, as shown in FIG. 1A, input signal paths to the IC chips 102 are isolated from one another by one or more isolators 116. In the absence of isolators 116, in some cases, a failure (e.g., short or open circuit) at an IC chip's signal input might cause corresponding shorts, open circuits, floating voltages, and/or other circuit effects at the signal inputs of other IC chips (e.g., based on electrical connections to a common control bus). The use of isolators 116 can reduce or prevent propagation of such failures and ensure that the failure of any one IC chip 102 at the IC chip's signal input does not affect the operation of other IC chips 102.

For example, each signal path between the controller 110 and a corresponding IC chip 102 can include a corresponding isolator 116 configured to isolate the signal input of the IC chip 102 (e.g., signal input 122) from signal inputs of other IC chips 102. For example, transmission paths 114a and 114b can each include a corresponding isolator 116 electrically connected between the signal inputs of the IC chips 102 and at least one control bus that provides the input signals 108. In some implementations, at least some of the isolators 116 are buffers.

In some implementations, at least some of the isolators 116 are resistors. A resistor can provide acceptable isolation at a lower cost than a buffer performing the isolation function. The resistor can have a resistance value sufficiently large that signal inputs of other IC chips 102 receive uncorrupted data in the case of a short at a driver of an IC chip 102, e.g., in view of the output characteristics of a driver of the controller 110 that provides the input signals 108 (e.g., a broadcast driver). The resistor can have a resistance value sufficiently small that bandwidth of the input signals 108 is effectively not limited by the resistor. For example, in some implementations, an isolation resistor (as an isolator 116) on a signal path to a signal input 122 has a resistance value in a range from 100Ω (ohm) to 10 kΩ (kilo-ohm). The foregoing resistance value can be provided by one or more resistors in series and/or parallel to provide a total isolation resistance in a range from 100Ω to 1 kΩ. In some implementations, other ranges of the resistance value are possible.

The use of isolation resistors (e.g., as opposed to more-expensive buffers) in some cases is facilitated by the use of relatively low-speed (low-frequency) signals being provided to the IC chips 102, compared to signals in other circuit systems. For example, a highest-speed signal being provided to the IC chips 102 may be a clock signal sent to clock inputs of the IC chips 102, as shown in FIGS. 2A-2B. In some implementations, the clock signal has a speed less than 100 MHz (e.g., 25 MHz). Other input signals, such as command input signals and reset input signals, can have speed less than 100 MHz, less than 50 MHz, less than 10 MHz, or less than 1 MHz, in various implementations. These speeds are compatible with the use of isolation resistors, whereas higher speeds commonly used for other applications may be incompatible with the use of isolation resistors, such that buffers would be used. The relatively low signal speeds used in some implementations of the circuits described herein may be associated with the relatively independent operation of the IC chips 102, which can independently perform hashing operations and independently provide outputs without requiring high-bandwidth input signals for control.

Further, the use of isolation resistors, in some implementations, is associated with the use of multiple (e.g., many) IC chips 102 having identical or largely similar circuitry on the same board 104, and with the expectation that at least some of the IC chips 102 can fail during standard use. If fewer (e.g., one) IC chip 102 were present, the cost benefits of using isolation resistors as opposed to buffers might be smaller, and buffers might be preferable. Further, if the IC chips 102 were not expected to fail, the isolators 116 might not be included.

In some implementations, one or more level-shifters are included on signal input transmission paths to the IC chips 102 (e.g., from the controller 110) and/or signal output transmission paths (e.g., electrically between the IC chips 102 and the event detector logic circuit 112). Input and/or output signals may be at different levels from one another, and the level-shifters can be configured to equalize the levels, e.g., for processing by the IC chips 102 and/or the event detector logic circuit 112.

Although FIG. 1A illustrates each IC chip 102 as receiving a corresponding signal input (e.g., a command input), in some implementations, each IC chip 102 receives multiple signal inputs, which can be provided by the controller 110 on separate and/or shared input lines. For example, in some implementations, each IC chip 102 receives a command input, a reset input (which can be used to selectively reset the IC chips 102), and a clock input (which carries a clock signal). Any or all of the lines/connections corresponding to these inputs can have an isolator 116 as discussed above.

In some implementations, in addition to or instead of configurations that compensate for signal-related IC chip failures, an electronic circuit is configured to compensate for power supply-related failures. FIG. 1A shows, in addition to the IC chips 102, components of the electronic circuit 100 that are configured to generate and transmit input signals for the IC chips 102 and/or receive/process output signals from the IC chips 102. The electronic circuit 100 includes additional components (e.g., power supply components) that are not shown in FIG. 1A.

FIG. 1B shows, in addition to the IC chips 102, components of the electronic circuit 100 that are configured to generate and provide power to the IC chips 102. The electronic circuit 100 includes additional components that are not shown in FIG. 1B, e.g., signal input, output, and processing components, including the components shown in FIG. 1A.

For example, in some implementations, as shown in FIG. 1B, the electronic circuit 100 includes at least two power supplies. In this example, the electronic circuit 100 includes a processor power supply (VDD supply) 140 and a secondary power supply (V2 supply) 142. In some implementations, the VDD supply 140 is configured to provide a low-voltage, high-current signal to each IC chip 102 to power the IC chip's internal processor (e.g., which performs hashing operations). For example, the VDD supply 140 may provide a power voltage of about 300 mV and a current of several hundred amps to the IC chips 102 in aggregate. In some implementations, the V2 supply 142 is configured to provide one or more higher-voltage, lower-current power signals (compared to the VDD supply 140), e.g., for powering input/output (I/O) functions of the IC chips 102 and/or internal operations of the IC chips 102 (e.g., phased-locked loop operation, temperature sensor operation, control logic, etc.). For example, in some implementations the V2 supply 142 includes a first power supply including a regulator configured to provide a voltage $V_{RM}$ to each IC chip 102 for I/O operations (e.g., at about 1.2 V-1.8 V), and a second power supply configured to provide another voltage (e.g., about 750 mV) to each IC chip 102 for the internal operations, both at low current. In some implementations, the first power supply and the second power supply are implemented separately. In some implementations, the electronic circuit 100 includes only a single power supply and/or other power supplies than those described explicitly here. In the example of FIG. 1B, power lines (e.g., power lines 146a, 146b, 146c) corresponding to only a single power provided by the V2 supply 142 are shown; it will be understood that power lines and isolator corresponding to additional powers provided by the V2 supply 142 can be included in some implementations.

Power can be supplied to the IC chips 102 through at least partially separate lines (e.g., interconnects, traces, etc.). For example, power line 150a provides power from the VDD supply 140 to a first IC chip 102, and power line 150b provides power from the VDD supply 140 to a second IC chip 102. The power lines for different IC chips 102 need not be entirely distinct from one another. For example, a primary line 146a of a power line can extend from the VDD supply 140 in proximity to multiple IC chips 102 in a group 106b, and extension lines 146b can extend from the primary line 146a to electrically connect to each of the multiple IC chips 102 in the group 106b. It will be understood that this arrangement of the power lines (and isolators, as discussed below) can, in some implementations, apply not only to the power lines from the V2 supply 142 but also to the power lines from the VDD supply and/or signal lines providing the input signals 108 to the signal inputs of the IC chips 102.

In the case of a short and/or open circuit on a power line and/or in a power-supply portion of an IC chip 102, in the absence of isolation, the power supply to other IC chips 102 may be negatively affected. Accordingly, in some implementations, at least one isolator is provided on a power transmission path. For example, as shown in FIG. 1B, the power transmission path from the V2 supply 142 to each IC chip 102 can include a corresponding isolator 148 (labeled as "I₁"). In this example, the isolators 148 are provided on the extension lines 146b, but other arrangements are also within the scope of this disclosure.

In some implementations, the isolators 148 are voltage regulators or buffers. In some implementations, the isolators 148 are resistors, e.g., an isolation resistor can be provided on at least some of the power transmission paths (e.g., instead of a voltage regulator or buffer). Resistors may provide acceptable isolation along with reduced costs compared to the use of a corresponding voltage regulator or buffer for each IC chip 102. In some implementations, the V2 supply 142 can include a voltage regulator that provides power output for each group 106a, 106b, 106c of IC chips 102.

In some implementations, isolators 149 (labeled as "I₂") can be provided on power transmission paths from the VDD supply 140 to the IC chips 102. These isolators 149, like the isolators 148, can be voltage regulators, buffers, and/or resistors.

An isolation resistor for the power supply can have a resistance sufficiently large that, in response to a power supply short at the corresponding IC chip 102, the short current is less than a maximum current that can be supplied by a voltage regulator (e.g., in the VDD supply 140 or the V2 supply 142) providing the power to the IC chip 102. The resistance can be sufficiently small that the voltage drop across the resistor (in the absence of a short) is an acceptably-small proportion of the voltage supplied by the voltage regulator, e.g., less than 10%, to avoid degrading the power supply to other IC chips 102. In some implementations, the resistance of an isolation resistor for power supply (as isolator 148 and/or 149) is in a range from 1Ω to 20Ω or in a range from 1Ω to 10Ω.

FIG. 2A illustrates an example of an IC chip 200. In some implementations, the IC chip 200 can be used as an IC chip 102 included in the electronic circuit 100 shown in FIGS. 1A-1B. The IC chip 200 includes various input and output terminals, including a clock-in terminal ("CLOCK_I") for receiving a clock signal (e.g., from the controller 110); a command-in terminal ("COMMAND_I") (corresponding to a signal input that receives input signals 108, e.g., signal input 122) for receiving commands (e.g., from the controller 110); and a response-out terminal ("RESPONSE_O") for outputting data, such as data indicative of nonces identified as a result of hash computations. The response-out-terminal can output data to the event detector logic circuit 112.

Other terminals included in this example of the IC chip 200 include reset-in terminal ("RESET_N_I") for receiving (e.g., from the controller) reset commands that cause the IC chip 200 to reset; a thermal trip-in ("THERMAL_TRIP_I") terminal for receiving thermal trip signals from a thermal trip bus; ID input(s) ("ID<7:0>") for receiving individual addressing/commands; and test mode-in ("TESTMODE_I") for enabling manufacturer test mode.

The IC chip 200 further includes terminals configured to provide signals to or from other IC chips 200 in cases in which the IC chip 200 is connected in a series configuration with the other IC chips 200. Using the output terminals illustrated in FIG. 2A, thermal trip signals, reset signals, clock signals, command signals, and test clock signals can be provided to a second IC chip 200, which can in turn pass those signals to a third IC chip 200, etc., so that common thermal trip, reset, clock, command, and/or test clock signals are provided, in series, to all IC chips 200 on the board 104 or to a group of IC chips 200. Circuitry 202 can permit signals, including computation results, to be transferred in series between IC chips 200. A response-in terminal can be configured to receive output signals, including computation results, from other IC chips 200.

The terminals shown in FIGS. 2A-2B are examples, and in some implementations the IC chip can not include one or more of the illustrated terminals, and/or can include one or more additional terminals. For example, as some of the terminals shown in FIG. 2A are included to facilitate a series-configured arrangement of the IC chips 102 that differs from the parallel-configured arrangement shown in FIG. 1A, in some implementation one or more of those terminals can be omitted. The IC chip 200 and IC chip 250 discussed below) can further include one or more power input terminals, e.g., a first power input terminal for receiving a power voltage from the VDD supply 140, and one or more second power input terminals for receiving one or more power voltages from the V2 supply 142.

The IC chip 200 can include a controller 204 configured to manage and coordinate operations of various components within the IC chip 200. Controller 204 can be configured to serve as an interface between hash engines 206 and other circuits or components of the IC chip 200. In some examples, the controller 204 can be configured to receive an input signal from the signal input, and to transmit a corresponding control signal to the hash engines 206. For example, after receiving a signal from the controller 110, the controller 204 can instruct the hash engines 206 to perform cryptographs hash computations. In some examples, the controller 204 can be communicatively coupled to the hash engines 206, and can obtain computation results from the hash engines 206. The controller 204 can transmit the computation results and/or values derived therefrom (e.g., signals indicating obtained nonce values) via the response-out terminal, e.g., as an output signal 128.

IC chip 200 further includes the one or more hash engines 206. In some implementations, each of the hash engines 206 includes hardware components configured to perform cryptographic hash computations. In some examples, the hash engines 206 can perform the cryptographic hash computations using hash function algorithms such as SHA-1, SHA-256, or MD5, etc.

A non-limiting example of signal inputs/outputs to the IC chip 200 is provided in Table 1. The reset signal can optionally be provided (e.g., by the controller 110) to cause the IC chip 200 to reset. The command-in signal can be provided (e.g., by the controller 110), for example, to cause the IC chip 200 to perform certain computations (e.g., hash computations) based on provided parameters, to poll the IC chip 200 to cause the IC chip 200 to output a computation result (if available), and/or for other commands. The response-out signal can include the computation results.

TABLE 1

| Signals | | |
|---|---|---|
| Signals | Type | Description |
| ID[n − 1:0] | Input | Used by controller to address/command each IC chip individually |
| clk-in reset command-in | | Direct broadcast signal (e.g., at the IC chip-level or aggregate circuit level). |
| response-out | Output | Serial response output |

In some implementations, relatively few signals are provided in/out of the IC chip 200 (e.g., as shown in Table 1), compared to IC chips configured for series operation in which control signals, response signals, etc., from each IC chip are provided to another IC chip. For example, in some implementations, the IC chip 200 does not receive/transmit a response-in signal from another IC chip, a clock-out signal for another IC chip, a reset-out signal for another IC chip, and/or a command-out signal for another IC chip. Correspondingly, in some implementations, the IC chip 200 does not include the terminals (shown in FIG. 2) corresponding to these signals, and/or does not include at least some of the indicated circuitry 202 that corresponds to processing these signals. For example, the TX terminal of the controller 204 can be connected directly to the response-out terminal of the IC chip 200. This reduction in terminals and/or circuit elements can, in some cases, provide reduced manufacturing costs and/or simplified chip operation.

For example, FIG. 2B illustrates another example of an IC chip 250 which can be used as an IC chip 102. The IC chip 250 is configured for parallel operation. For example, the IC chip 250 can be configured to receive reset, clock, and command signals in parallel with other IC chips 250 (e.g., from controller 110, as opposed to from another IC chip 250), and to provide output signals, including computation results, in parallel with other IC chips 250 (e.g., to the event detector logic circuit 112, as opposed to another IC chip 250). The terminals, elements, and operation of the IC chip 250 can be configured as described for the IC chip 200, except where noted otherwise or suggested otherwise by context. Each of the command-in, clock-in, reset-in, and thermal trip-in terminals can correspond to input terminals 122 in FIG. 1A (e.g., respective different input terminals 122), and the response-out terminal can correspond to output terminals 124 in FIG. 1A.

In some implementations, an IC chip having terminals for a series configuration, such as the IC chip 200, can be operated with parallel operation. For example, the IC chip 200 can be used as the IC chip 102 in the parallel configuration of FIG. 2A, and terminals of the IC chip 200 that are not included in the IC chip 250 can be inactive. As such, the IC chip 200 can flexibly be included in both series-configured electronic circuits and parallel-configured electronic circuits such as electronic circuit 100.

FIG. 3 illustrates an example of a process 300 that can be performed according to some implementations of the present disclosure. For example, the process 300 can be performed by the electronic circuit 100. The process 300 can have characteristics as described in reference to FIGS. 1A-1B and FIGS. 2A-2B.

The process 300 includes performing computations (e.g., hash computations) using a plurality of IC chips (e.g., IC chips 102) (302). For example, the controller 110 transmits input signal(s) 108 to the plurality of IC chips 102 in parallel (e.g., via at least one control bus), to command/enable the IC chips 102 to perform hash computations.

The process 300 includes transmitting, in parallel, a plurality of output signals of the plurality of IC chips to an event detector logic circuit (e.g., event detector logic circuit 112) (304). For example, in some implementations, the plurality of output signals includes a first output signal that includes data (for example, an output of the computations). For example, the first output signal can include a series of non-static bits that encodes data, such as a nonce value. In some implementations, the plurality of output signals includes one or more static output signals (e.g., static "1" or static "0"). For example, one or more IC chips 102 transmit, through respective output terminals 124, respective output signals 128 to the event detector logic circuit 112. The output signals 128 can include, for example, idle signal(s) (e.g., predetermined sequence(s) and/or static signals), signal(s) resulting from chip failure (e.g., static signals), and/or data signal(s) that encode data such as nonce values.

The process 300 includes generating, by the event detector logic circuit, a data output signal that includes data obtained from a first output signal of the plurality of output signals (306). For example, the data obtained from the first output signal can include, can indicate, or can be obtained from (e.g., can be obtained by processing) a nonce value or another result of a computation performed by an IC chip and output in the first output signal. In some implementations, the data is included in the data output signal independently of a presence and polarity of any static output signals of the plurality of output signals. For example, the event detector logic circuit 112 can perform a combined XOR operation on the output signals 128 received from the plurality of the IC chips 102 in parallel, and the output of the combined XOR operation is included in, or is, the data output signal. Based on the parallel configuration, in some implementations, signal-related failures of the IC chips that result in static IC chip outputs result in at most inversion of the data output signal (e.g., the output of the combined XOR operation). As another example, the event detector logic circuit can analyze the output signals in parallel (e.g., concurrently), detect that the first output signal includes or indicates data (e.g., by determining whether each output signal is static), and include the data in the data output signal based on the detection.

The process 308 includes transmitting the data output signal to a computing device (e.g., controller 110) (308). For example, the event detector logic circuit 112 can transmit the output of the combined XOR operation, which can include, indicate, or be obtained from a result of the computations, as an output 118 to the controller 110 or to another computing device. The controller or the other computing device can determine a polarity of the output and extract the result of the computations, or another value based on the result of the computations, based on the polarity.

Some implementations of the subject matter and operations described in this specification can be implemented in digital electronic circuitry, or in computer software, firmware, or hardware, including the structures disclosed in this specification and their structural equivalents, or in combinations of one or more of them. For example, in some implementations, the controller 110, the event detector logic circuit 112, the controller 204, and/or the hash engines 206, can be implemented using digital electronic circuitry, or in computer software, firmware, or hardware, or in combinations of one or more of them. As another example, the process 300 shown in FIG. 3 can be implemented using digital electronic circuitry, or in computer software, firmware, or hardware, or in combinations of one or more of them.

Some implementations described in this specification can be implemented as one or more groups or modules of digital electronic circuitry, computer software, firmware, or hardware, or in combinations of one or more of them. Although different modules can be used, each module need not be distinct, and multiple modules can be implemented on the same digital electronic circuitry, computer software, firmware, or hardware, or combination thereof.

Some implementations described in this specification can be implemented as one or more computer programs, that is, one or more modules of computer program instructions, encoded on computer storage medium for execution by, or to control the operation of, data processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (for example, multiple CDs, disks, or other storage devices).

The term "data processing apparatus" encompasses all kinds of apparatuses, devices, and machines for processing data, including by way of example a programmable processor, a computer, a system on a chip, or multiple ones, or combinations, of the foregoing. The apparatus can include special purpose logic circuitry, for example, an FPGA (field programmable gate array) or an ASIC (application specific integrated circuit). The apparatus can also include, in addition to hardware, code that creates an execution environment for the computer program in question, for example, code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages. A computer program may, but need not, correspond to a file in a file system. A program can be stored in a portion of a file that holds other programs or data (for example, one or more scripts stored in a markup language document), in a single file dedicated to the program in question, or in multiple coordinated files (for example, files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, for example, an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read only memory or a random access memory or both. A computer includes a processor for performing actions in accordance with instructions and one or more memory devices for storing instructions and data. A computer can also include, or be operatively coupled to receive data from or transfer data to, or both, one or more mass storage devices for storing data, for example, magnetic, magneto optical disks, or optical disks. However, a computer need not have such devices. Devices suitable for storing computer program instructions and data include all forms of non-volatile memory, media and memory devices, including by way of example semiconductor memory devices (for example, EPROM, EEPROM, AND flash memory devices), magnetic disks (for example, internal hard disks, and removable disks), magneto optical disks, and CD-ROM and DVD-ROM disks. The processor and the memory can be supplemented by, or incorporated in, special purpose logic circuitry.

To provide for interaction with a user, operations can be implemented on a computer having a display device (for example, a monitor, or another type of display device) for displaying information to the user. The computer can also include a keyboard and a pointing device (for example, a mouse, a trackball, a tablet, a touch sensitive screen, or another type of pointing device) by which the user can provide input to the computer. Other kinds of devices can be used to provide for interaction with a user as well. For example, feedback provided to the user can be any form of sensory feedback, such as visual feedback, auditory feedback, or tactile feedback. Input from the user can be received in any form, including acoustic, speech, or tactile input. In addition, a computer can interact with a user by sending documents to and receiving documents from a device that is used by the user. For example, a computer can send webpages to a web browser on a user's client device in response to requests received from the web browser.

A computer system can include a single computing device, or multiple computers that operate in proximity or generally remote from each other and typically interact through a communication network. Examples of communication networks include a local area network ("LAN") and a wide area network ("WAN"), an inter-network (for example, the Internet), a network including a satellite link, and peer-to-peer networks (for example, ad hoc peer-to-peer networks). A relationship of client and server can arise by virtue of computer programs running on the respective computers and having a client-server relationship to each other.

Figure 4:
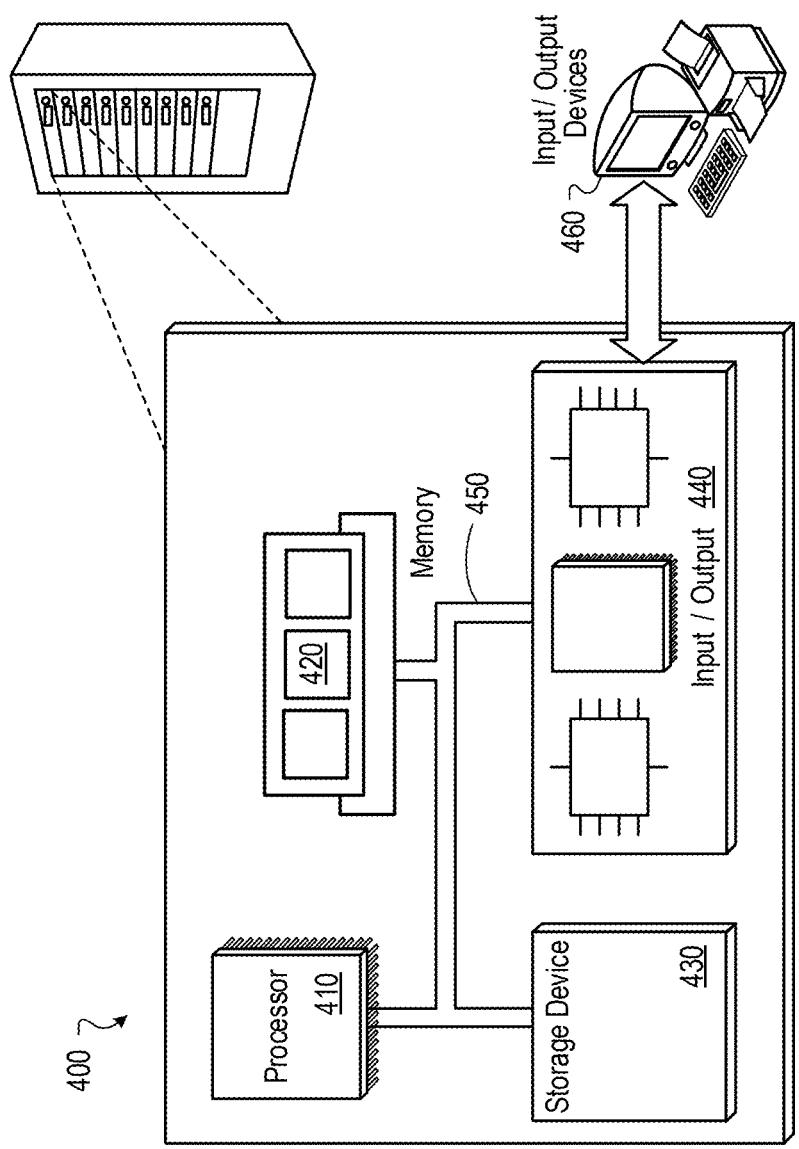
FIG. 4 is a diagram illustrating an example of a computer system.

For example, FIG. 4 illustrates an example of a computer system 400 that includes a processor 410, a memory 420, a storage device 430 and an input/output device 440. Each of the components 410, 420, 430 and 440 can be interconnected, for example, by a system bus 450. The processor 410 is capable of processing instructions for execution within the system 400. In some implementations, the processor 410 is a single-threaded processor, a multi-threaded processor, or another type of processor. The processor 410 is capable of processing instructions stored in the memory 420 or on the storage device 430. In some implementations, the controller 110, the event detector logic circuit 112, the controller 204, and/or the hash engines 206 can be implemented using, or as, the processors 410 and/or multiple such processors 410, or using, or as, the computer system 400 or multiple such computer systems 400. The memory 420 and the storage device 430 can store information within the system 400.

The input/output device 440 provides input/output operations for the system 400. In some implementations, the input/output device 440 can include one or more of a network interface device, for example, an Ethernet card, a serial communication device, for example, an RS-232 port, or a wireless interface device, for example, an 802.11 card, a 3G wireless modem, a 4G wireless modem, or a 5G wireless modem, or both. In some implementations, the input/output device 440 can include driver devices configured to receive input data and send output data to other input/output devices, for example, keyboard, printer and display devices 460. In some implementations, the input/output device 440 can include device interconnections such as cabling, wiring, signal-carrying standoffs, bump bonds, and/or the like. In some implementations, mobile computing devices, mobile communication devices, and other devices can be used.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable sub-combination.

A number of embodiments have been described. Nevertheless, various modifications can be made without departing from the spirit and scope of the invention. Accordingly, other embodiments are within the scope of the claims.

What is claimed is:

1. An electronic circuit, comprising:
   an event detector logic circuit;
   a computing device; and
   a plurality of integrated circuit (IC) chips that are electrically connected in parallel between at least one control bus configured to provide input signals and the event detector logic circuit,
   wherein the event detector logic circuit is configured to:
      receive a plurality of output signals from the plurality of IC chips,
      generate a data output signal that includes data obtained from a first output signal of the plurality of output signals, the data output signal generated such that the data is included in the data output signal independently of a presence and polarity of any static output signals of the plurality of output signals, and
      transmit the data output signal to the computing device.

2. The electronic circuit of claim 1, wherein the event detector logic circuit comprises an XOR logic element configured to:
   perform a combined XOR operation on the plurality of output signals; and
   transmit, as the data output signal, an output of the combined XOR operation to the computing device.

3. The electronic circuit of claim 1, wherein the event detector logic circuit is configured to detect whether the plurality of output signals include data or are static.

4. The electronic circuit of claim 1, wherein the event detector logic circuit is configured to generate the data output signal such that the data output signal indicates changes in the plurality of output signals.

5. The electronic circuit of claim 4, wherein the event detector logic circuit is configured to generate the data output signal such that the data output signal indicates bit-to-bit changes in the plurality of output signals.

6. The electronic circuit of claim 1, wherein the event detector logic circuit is configured to generate the data output signal such that a presence of bit-to-bit changes in the data output signal is independent of the presence and polarity of any static output signals of the plurality of output signals.

7. The electronic circuit of claim 1, wherein the event detector logic circuit is configured to generate the data output signal such that a polarity of the data output signal is based on the presence and polarity of any static output signals of the plurality of output signals.

8. The electronic circuit of claim 1, wherein the data in the data output signal is encoded as a plurality of bits, and
   wherein the event detector logic circuit is configured to generate the data output signal such that a polarity of the plurality of bits is based on the presence and polarity of any static output signals of the plurality of output signals.

9. The electronic circuit of claim 1, wherein the computing device is configured to:
   determine a polarity of the data output signal; and
   extract the data from the data output signal based on the determined polarity.

10. The electronic circuit of claim 1, comprising a plurality of isolation resistors electrically connected between a signal input of each of the plurality of IC chips and the at least one control bus.

11. The electronic circuit of claim 1, comprising:
    a power supply configured to provide a supply voltage to a power input of each of the plurality of IC chips; and
    a plurality of isolation resistors electrically connected between the power input of each of the plurality of IC chips and the power supply.

12. The electronic circuit of claim 1, wherein the computing device is configured to identify a predetermined non-static signal in the data output signal.

13. The electronic circuit of claim 1, wherein an IC chip of the plurality of IC chips comprises at least one processor unit configured to perform one or more mathematical computations, and
    wherein the IC chip is configured to generate an output signal based on the one or more mathematical computations and forward the output signal to the event detector logic circuit as one of the plurality of output signals.

14. The electronic circuit of claim 13, wherein the one or more mathematical computations comprise cryptographic hash computations, and
    wherein the output signal comprises an indication of a result of the cryptographic hash computations.

15. The electronic circuit of claim 13, wherein the IC chip is configured to automatically generate and forward the output signal in response to determining that the one or more mathematical computations satisfy an objective.

16. A method, comprising:
    performing computations using a plurality of integrated circuit (IC) chips;
    transmitting, in parallel, a plurality of output signals of the plurality of IC chips to an event detector logic circuit;
    generating, by the event detector logic circuit, a data output signal that includes data obtained from a first output signal of the plurality of output signals, such that the data is included in the data output signal independently of a presence and polarity of any static output signals of the plurality of output signals; and
    transmitting the data output signal to a computing device.

17. The method of claim 16, wherein generating the data output signal comprises performing a combined XOR operation on the plurality of output signals, wherein the data output signal comprises an output of the combined XOR operation.

18. The method of claim 16, comprising detecting, by the event detection logic circuit, whether the plurality of output signals include data or are static.

19. The method of claim 16, comprising generating the data output signal such that the data output signal indicates changes in the plurality of output signals.

20. The method of claim 19, comprising generating the data output signal such that the data output signal indicates bit-to-bit changes in the plurality of output signals.

21. The method of claim 16, comprising generating the data output signal such that a presence of bit-to-bit changes in the data output signal is independent of the presence and polarity of any static output signals of the plurality of output signals.

22. The method of claim 16, comprising generating the data output signal such that a polarity of the data output signal is based on the presence and polarity of any static output signals of the plurality of output signals.

23. The method of claim 16, comprising generating the data output signal such that:
   the data in the data output signal is encoded as a plurality of bits, and
   a polarity of the plurality of bits is based on the presence and polarity of any static output signals of the plurality of output signals.

24. The method of claim 16, comprising:
   determining, by the computing device, a polarity of the data output signal; and
   extracting, by the computing device, the data from the data output signal based on the determined polarity.

25. The method of claim 16, comprising electrically isolating a signal input of each of the plurality of IC chips from other IC chips using a plurality of isolation resistors electrically connected between the plurality of IC chips and at least one control bus.

26. The method of claim 16, comprising:
   providing a supply voltage to a power input of each of the plurality of IC chips; and
   electrically isolating the power input of each of the plurality of IC chips from other IC chips using a plurality of isolation resistors on power transmission paths providing the supply voltage.

27. The method of claim 16, comprising:
   performing, by an IC chip of the plurality of IC chips, one or more mathematical computations;
   generating, by the IC chip, an output signal based on the one or more mathematical computations; and
   forwarding, by the IC chip, the output signal to the event detector logic circuit, as one of the plurality of output signals.

28. The method of claim 27, wherein the one or more mathematical computations comprise cryptographic hash computations, and
   wherein the output signal comprises an indication of a result of the cryptographic hash computations.

29. The method of claim 27, comprising automatically generating and forwarding the output signal in response to determining that the one or more mathematical computations satisfy an objective.

30. An electronic circuit, comprising:
   a plurality of integrated circuit (IC) chips that are electrically connected in parallel between (i) at least one control bus configured to provide input signals and (ii) circuitry configured to receive output signals from the plurality of IC chips;
   a power supply configured to provide a supply voltage to a power input of each of the plurality of IC chips; and
   a plurality of isolation resistors electrically connected between at least one of:
   (i) a signal input of each of the plurality of IC chips and the at least one control bus, or
   (ii) the power input of each of the plurality of IC chips and the power supply.

* * * * *